United States Patent
Mateescu et al.

(10) Patent No.: US 9,070,483 B2
(45) Date of Patent: Jun. 30, 2015

(54) ENCODING AND DECODING REDUNDANT BITS TO ACCOMMODATE MEMORY CELLS HAVING STUCK-AT FAULTS

(71) Applicant: HGST Netherlands B.V., Amsterdam (NL)

(72) Inventors: Robert Eugeniu Mateescu, San Jose, CA (US); Luiz Franca-Neto, Sunnyvale, CA (US); Cyril Guyot, San Jose, CA (US); Hessam Mahdavifar, San Diego, CA (US); Zvonimir Bandic, San Jose, CA (US); Qingbo Wang, Irvine, CA (US)

(73) Assignee: HGST Netherlands B.V., Amsterdam (NL)

( * ) Notice: Subject to any disclaimer, the term of this patent is extended or adjusted under 35 U.S.C. 154(b) by 261 days.

(21) Appl. No.: 13/649,108

(22) Filed: Oct. 10, 2012

(65) Prior Publication Data
US 2014/0101517 A1    Apr. 10, 2014

(51) Int. Cl.
| | |
|---|---|
| G06F 11/10 | (2006.01) |
| G11C 29/00 | (2006.01) |
| G06F 11/00 | (2006.01) |
| G11C 29/52 | (2006.01) |
| G11C 29/04 | (2006.01) |

(52) U.S. Cl.
CPC .............. G11C 29/802 (2013.01); G11C 29/52 (2013.01); G11C 2029/0411 (2013.01); G06F 11/1048 (2013.01)

(58) Field of Classification Search
None
See application file for complete search history.

(56) References Cited

U.S. PATENT DOCUMENTS

| | | | |
|---|---|---|---|
| 3,949,208 A | 4/1976 | Carter | |
| 6,839,275 B2 | 1/2005 | Van Brocklin et al. | |
| 6,996,017 B2 | 2/2006 | Scheuerlein et al. | |
| 7,069,494 B2 * | 6/2006 | Cargnoni et al. | 714/763 |
| 7,533,321 B2 * | 5/2009 | Bell et al. | 714/763 |
| 8,144,037 B2 | 3/2012 | Monro | |
| 8,352,839 B2 * | 1/2013 | Franceschini et al. | 714/779 |
| 8,589,762 B2 * | 11/2013 | Rivers et al. | 714/763 |
| 2010/0277989 A1 | 11/2010 | Elfadel et al. | |
| 2010/0332895 A1 | 12/2010 | Billing et al. | |
| 2011/0080781 A1 | 4/2011 | Goux | |
| 2011/0119538 A1 | 5/2011 | Ipek et al. | |

(Continued)

OTHER PUBLICATIONS

Eric Deal, "Trends in NAND Flash Memory Error Correction," Jun. 2009, Cyclic Design, pp. 1-11.

(Continued)

*Primary Examiner* — Justin R Knapp
(74) *Attorney, Agent, or Firm* — Steven J. Cahill

(57) ABSTRACT

A data storage system has a memory circuit that comprises memory cells and a control circuit that receives data bits provided for storage in the memory cells. The control circuit encodes the data bits to generate a first set of redundant bits and encoded data bits, such that the encoded data bits selected for storage in a first subset of the memory cells with first stuck-at faults have digital values of corresponding ones of the first stuck-at faults. The control circuit encodes the first set of redundant bits to generate a second set of redundant bits. The control circuit performs logic functions on the second set of redundant bits and the encoded data bits to generate a third set of redundant bits, such that redundant bits in the third set of redundant bits selected for storage in a second subset of the memory cells with second stuck-at faults have digital values of corresponding ones of the second stuck-at faults.

20 Claims, 11 Drawing Sheets

(56) References Cited

U.S. PATENT DOCUMENTS

2011/0296258 A1 12/2011 Schechter et al.
2011/0307670 A1 12/2011 Franceshini et al.
2011/0317480 A1 12/2011 Lung et al.
2013/0332799 A1* 12/2013 Cho et al. ............... 714/764

OTHER PUBLICATIONS

R. Micheloni, et al., "A 4Gb 2b/cell NAND Flash Memory with Embedded 5b BCH ECC for 36MB/s System Read Throughput," 2006 IEEE International Solid-State Circuits Conference, Feb. 6, 2006, Non-Volatile Memory, 7.6, pp. 1-10.
U.S. Appl. No. 13/649,072, filed Oct. 10, 2012.
H.-S. Philip Wong, et al., "Phase Change Memory," vol. 98, No. 12, Dec. 2010, Proceedings of the IEEE, pp. 2201-2227.
Nak Hee Seong, et al., "SAFER: Stuck-At-Fault Error Recovery for Memories," 2010 43rd Annual IEEE/ACM International Symposium on Microarchitecture, pp. 115-124, Dec. 8, 2010.
Stuart Schechter et al., "Use ECP, not ECC, for hard failures in resistive memories," ISCA'10 Proceedings of the 37th annual international symposium on Computer architecture, Jun. 2010, pp. 141-152.
U.S. Appl. No. 13/649,007, filed Oct. 10, 2012.
Maddah et al., "Data Dependent Sparing to Manage Better-Than-Bad Blocks," Computer Science Department, University of Pittsburgh, Apr. 30, 2012.
U.S. Appl. No. 13/649,098, filed Oct. 10, 2012.

* cited by examiner

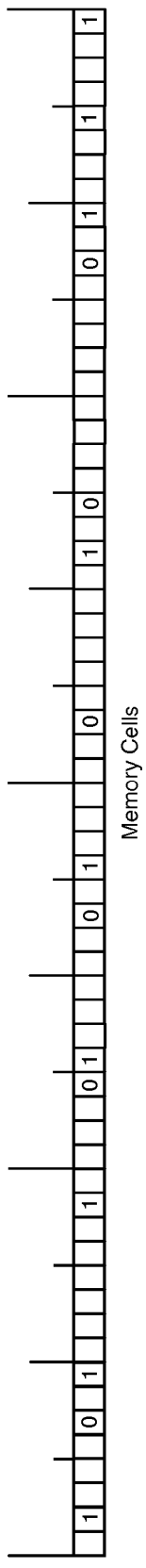
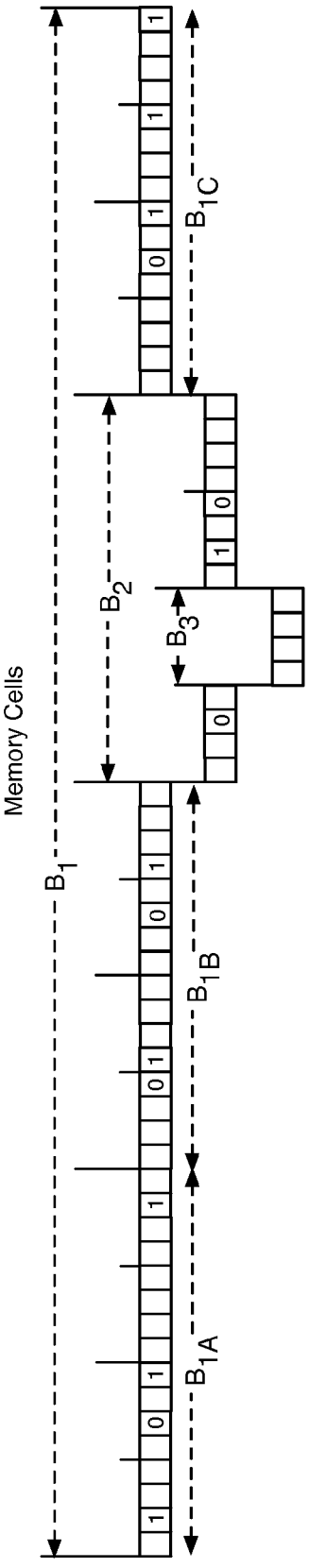

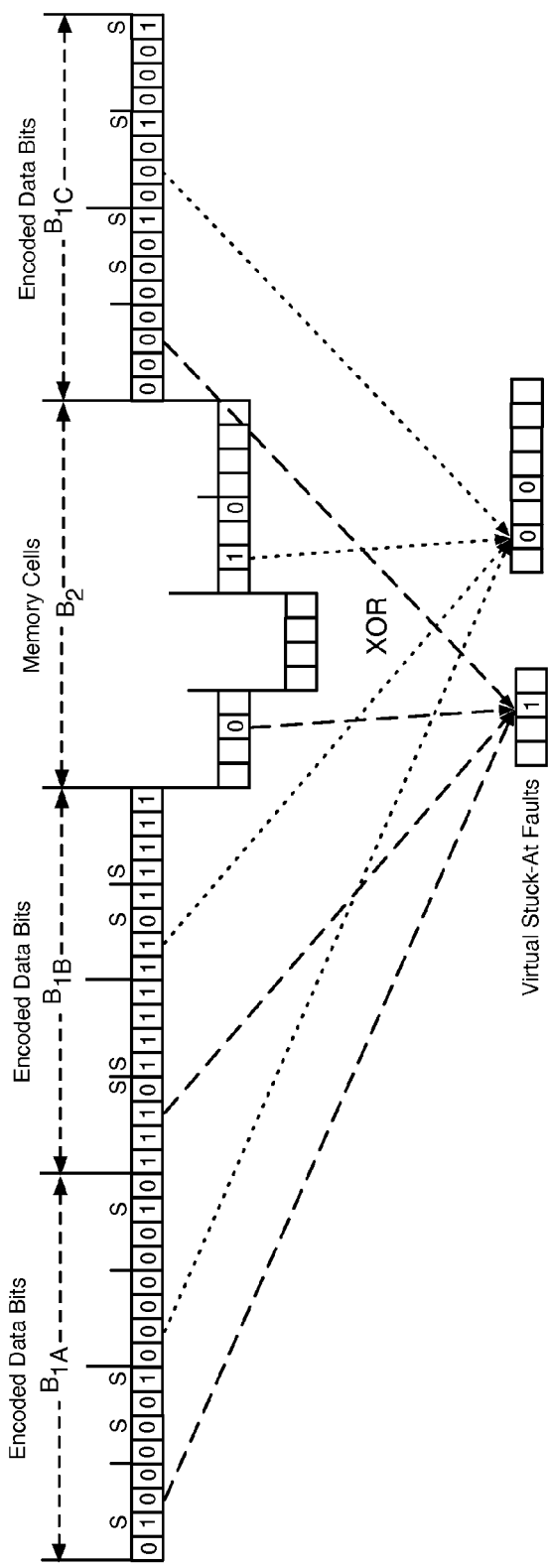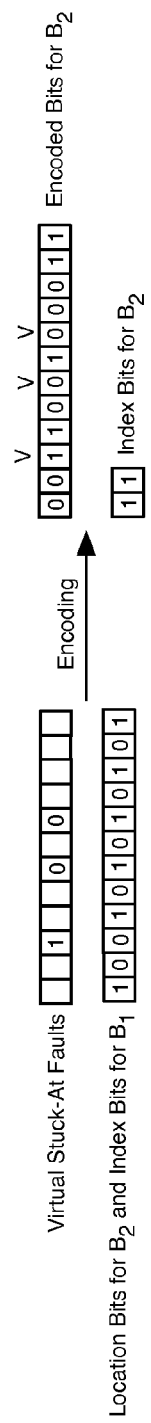
FIG. 5E
FIG. 5F

ENCODING AND DECODING REDUNDANT BITS TO ACCOMMODATE MEMORY CELLS HAVING STUCK-AT FAULTS

FIELD OF THE DISCLOSURE

The present disclosure relates to data storage systems, and more particularly, to techniques for encoding and decoding redundant bits to accommodate memory cells having stuck-at faults.

BACKGROUND

Many data communication systems use error correction encoders and decoders to detect and correct errors in data. Storage systems are frequently modeled as a communication system with a delay, where data is transmitted during a write operation and data is received at a read operation. In a storage system, random errors can be corrected up to a rate of about $1 \times 10^{-4}$ with an acceptable overhead. To protect against an error rate of about $1 \times 10^{-4}$, an error correction encoder may generate encoded bits having about 10% more bits than its input bits.

Phase change memory (PCM) is a class of non-volatile semiconductor memory. PCM devices have many advantages over traditional non-volatile flash memory. However, PCM devices may generate a large number of errors that are induced by writing cycle degradation. For example, a PCM device may generate errors at a rate of $1 \times 10^{-2}$ or greater if cycled to millions or tens of millions of cycles.

At the limits of endurance, the error rate in non-volatile memory devices is dominated by writing cycle degradation, not by random errors. Errors that are caused by degradation include stuck-at faults and unstable bits. Each of these two types of errors have different statistics than the random errors that are commonly assumed in data communication systems and corresponding error correcting approaches.

BRIEF SUMMARY

According to some embodiments, a data storage system has a memory circuit that comprises memory cells and a control circuit that receives data bits provided for storage in the memory cells. The control circuit encodes the data bits to generate a first set of redundant bits and encoded data bits, such that the encoded data bits selected for storage in a first subset of the memory cells with first stuck-at faults have digital values of corresponding ones of the first stuck-at faults. The control circuit encodes the first set of redundant bits to generate a second set of redundant bits. The control circuit performs logic functions on the second set of redundant bits and the encoded data bits to generate a third set of redundant bits, such that redundant bits in the third set of redundant bits selected for storage in a second subset of the memory cells with second stuck-at faults have digital values of corresponding ones of the second stuck-at faults.

According to other embodiments, a data storage system has a memory circuit that comprises memory cells and a control circuit that receives encoded bits read from the memory cells. The encoded bits accommodate stuck-at faults in the memory cells. The control circuit performs bitwise logic functions on first sets of the encoded bits to generate first intermediate bits. The control circuit performs the bitwise logic functions on second sets of the encoded bits to generate second intermediate bits. Each of the second sets has more bits than each of the first sets. The control circuit decodes the second intermediate bits using the first intermediate bits to generate first decoded bits. The control circuit decodes a first subset of the encoded bits using the first decoded bits to generate decoded data bits.

Various objects, features, and advantages of the present invention will become apparent upon consideration of the following detailed description and the accompanying drawings.

BRIEF DESCRIPTION OF THE DRAWINGS

FIGS. 5A-5I illustrate examples of the encoding operations shown in and described with respect to FIGS. 3A-3B, according to embodiments of the present invention.

DETAILED DESCRIPTION

Figure 1:
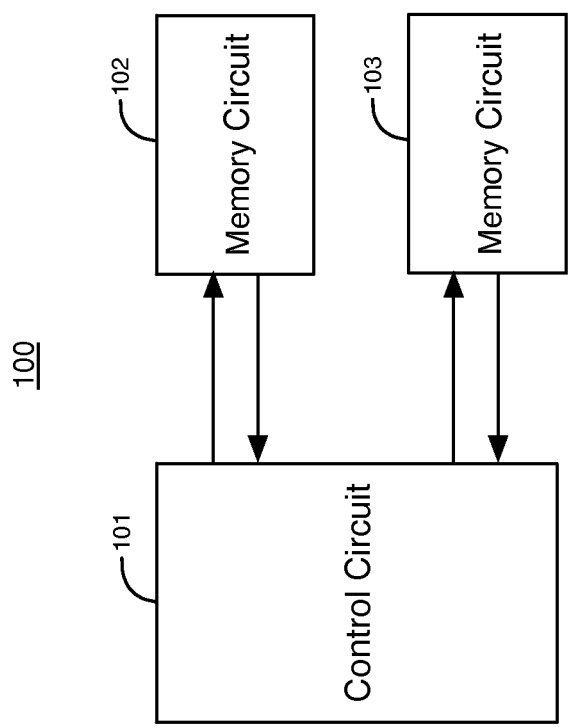
FIG. 1 illustrates an example of a data storage system, according to an embodiment of the present invention.

According to some embodiments, data bits are provided for storage in memory cells of a memory circuit. One or more of the memory cells of the memory circuit may contain stuck-at faults. An encoder encodes the data bits to generate encoded data bits and redundant bits. If the redundant bits correspond to memory cells of the memory circuit that have stuck-at faults, the encoder encodes the redundant bits to generate encoded redundant bits. The encoded data bits and the encoded redundant bits are stored in the memory cells of the memory circuit. The encoded data bits and the encoded redundant bits accommodate the memory cells in the memory circuit that have stuck-at faults. The memory circuit may be, for example, a phase change memory circuit (e.g., that uses chalcogenide glass) or another type of memory circuit that has stuck-at faults.

A memory cell having a stuck-at fault is a memory cell that can only store a single digital value. A memory cell having a stuck-at fault value of 1 can only store a logic high digital value, and a memory cell having a stuck-at fault value of 0 can only store a logic low digital value. Thus, only a logic high digital value can be read from a memory cell having a stuck-at fault value of 1 (i.e., stuck-at 1), and only a logic low digital value can be read from a memory cell having a stuck-at fault value of 0 (i.e., stuck-at 0). Memory cells having stuck-at faults generally have stuck-at fault values that are stable over time.

If some of the memory cells in the memory circuit have stuck-at faults, the digital values of the stuck-at faults and the addresses of the memory cells having the stuck-at faults are determined before the encoding process and are provided to the encoder. The encoder generates the encoded data bits and the encoded redundant bits using the digital values and addresses of the stuck-at faults. The encoded data bits and the encoded redundant bits are stored in the memory cells of the memory circuit.

Subsequently, the encoded data bits and the encoded redundant bits are read from the memory cells and are provided to a decoder. The decoder decodes the encoded redundant bits and then decodes the encoded data bits using the decoded redundant bits to regenerate the data bits. The data bits regenerated by the decoder do not contain errors that are caused by the known stuck-at faults in the memory circuit.

The techniques described herein are directly applicable to multi-level memory cells. Multi-level memory cells can store more than one bit per memory cell. For example, if a memory cell holds 2 bits, and it becomes stuck, then the values of those two bits are fixed, and they can be treated as two separate stuck-at fault locations. Because the location of one of the stuck-at faults is known, the location of the other stuck-at fault is also known. As a result, for the same stuck-at fault error rate, less redundant bits can be generated for multi-level memory cells than the redundant bits that are generated for single-level memory cells. The number of redundant bits may be smaller, for example, by a factor equal to the number of bits per memory cell.

FIG. 1 illustrates an example of a data storage system 100, according to an embodiment of the present invention. Data storage system 100 includes a control circuit 101, a memory circuit 102, and a memory circuit 103. Control circuit 101 may be, for example, a memory controller circuit, a processor circuit, or any other type of control circuit that encodes and/or decodes data bits for storage in memory circuits 102-103. Control circuit 101 provides the encoded data bits and the encoded redundant bits to one or both of memory circuits 102-103. The encoded data bits and the encoded redundant bits are stored in one or both of memory circuits 102-103. During a read operation, the encoded data bits and the encoded redundant bits are read from the memory circuit and provided to control circuit 101. The encoded data bits and the encoded redundant bits are transmitted between control circuit 101 and memory circuits 102-103 through one or more on-chip or external buses or through other types of signal lines.

Control circuit 101, memory circuit 102, and memory circuit 103 may be in the same integrated circuit or in separate integrated circuits. Thus, system 100 may be a single integrated circuit device that includes circuits 101-103. Alternatively, system 100 may include three separate integrated circuit devices 101-103.

Figure 2A:
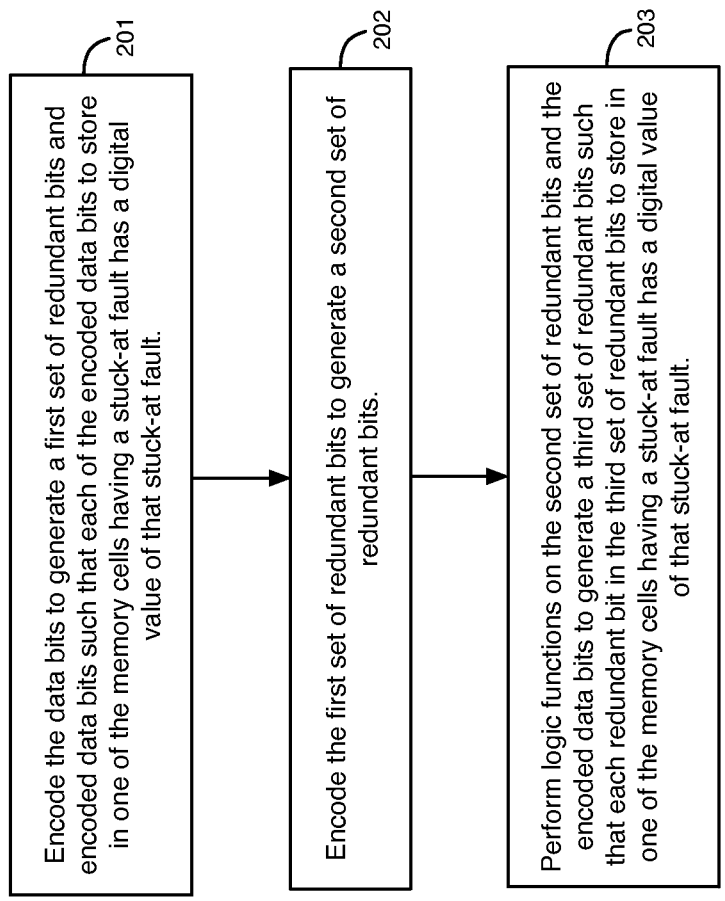
FIG. 2A is a flow chart that illustrates examples of operations for encoding data bits to generate encoded data bits and encoded redundant bits for storage in memory cells of a memory circuit, according to an embodiment of the present invention.

FIG. 2A is a flow chart that illustrates examples of operations for encoding data bits to generate encoded data bits and encoded redundant bits for storage in memory cells of a memory circuit, according to an embodiment of the present invention. Each of the memory cells in the memory circuit stores at least one digital value. One or more of the memory cells has a stuck-at fault. The encoded data bits and the encoded redundant bits generated by the operations of FIG. 2A are stored in the memory cells instead of the data bits. The operations of FIG. 2A may, for example, be performed by an encoder in control circuit 101.

Initially, an encoder receives data bits that are provided for storage in the memory cells of the memory circuit. Each of the data bits is provided for storage in a corresponding memory cell of the memory circuit. One or more of the data bits is provided for storage in a corresponding memory cell that has a known stuck-at fault. The addresses of the memory cells with stuck-at faults and the digital values of the stuck-at faults are provided to the encoder prior to performing the operations of FIG. 2A.

In operation 201, the encoder encodes the data bits to generate a first set of redundant bits and encoded data bits such that each of the encoded data bits to store in one of the memory cells having a stuck-at fault has a digital value of that stuck-at fault. In operation 202, the encoder encodes the first set of redundant bits to generate a second set of redundant bits.

In operation 203, the encoder performs logic functions on the second set of redundant bits and the encoded data bits to generate a third set of redundant bits such that each redundant bit in the third set of redundant bits to store in one of the memory cells having a stuck-at fault has a digital value of that stuck-at fault. The encoded data bits and the third set of redundant bits are stored in at least a subset of the memory cells.

Figure 2B:
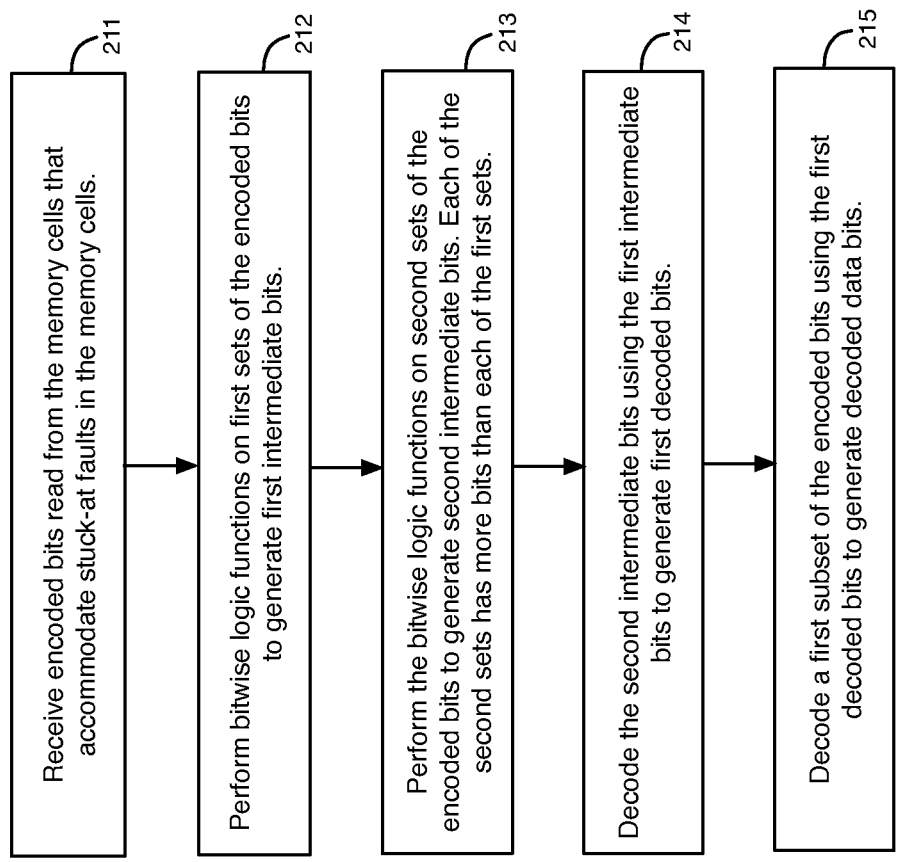
FIG. 2B is a flow chart that illustrates examples of operations for decoding encoded bits read from memory cells of a memory circuit to generate decoded data bits, according to an embodiment of the present invention.

FIG. 2B is a flow chart that illustrates examples of operations for decoding encoded bits read from memory cells of a memory circuit to generate decoded data bits, according to an embodiment of the present invention. Each of the memory cells in the memory circuit stores at least one digital value. One or more of the memory cells has a stuck-at fault. The operations of FIG. 2B may, for example, be performed by a decoder in control circuit 101. The addresses of the memory cells with stuck-at faults and the digital values of the stuck-at faults are not known by the decoder prior to performing the operations of FIG. 2B.

In operation 211, the decoder receives encoded bits read from the memory cells. The encoded bits accommodate stuck-at faults in the memory cells. In operation 212, the decoder performs bitwise logic functions on first sets of the encoded bits to generate first intermediate bits. In operation 213, the decoder performs the bitwise logic functions on second sets of the encoded bits to generate second intermediate bits. Each of the second sets has more bits than each of the first sets. In operation 214, the decoder decodes the second intermediate bits using the first intermediate bits to generate first decoded bits. In operation 215, the decoder decodes a first subset of the encoded bits using the first decoded bits to generate the decoded data bits.

Figure 3A:
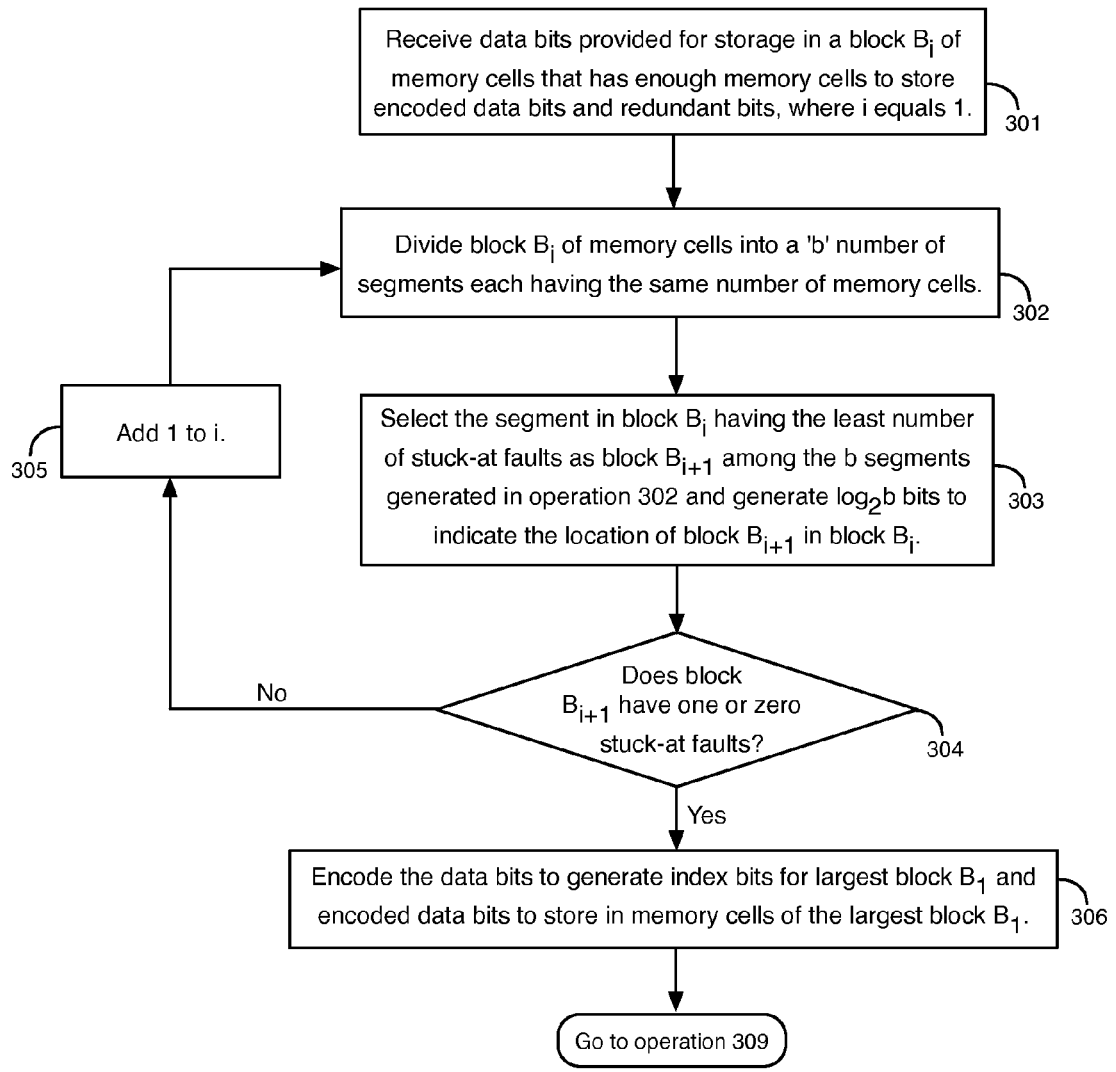
FIGS. 3A-3B illustrate examples of operations for encoding data bits to generate encoded bits that accommodate stuck-at faults in memory cells, according to an embodiment of the present invention.
Figure 3B:
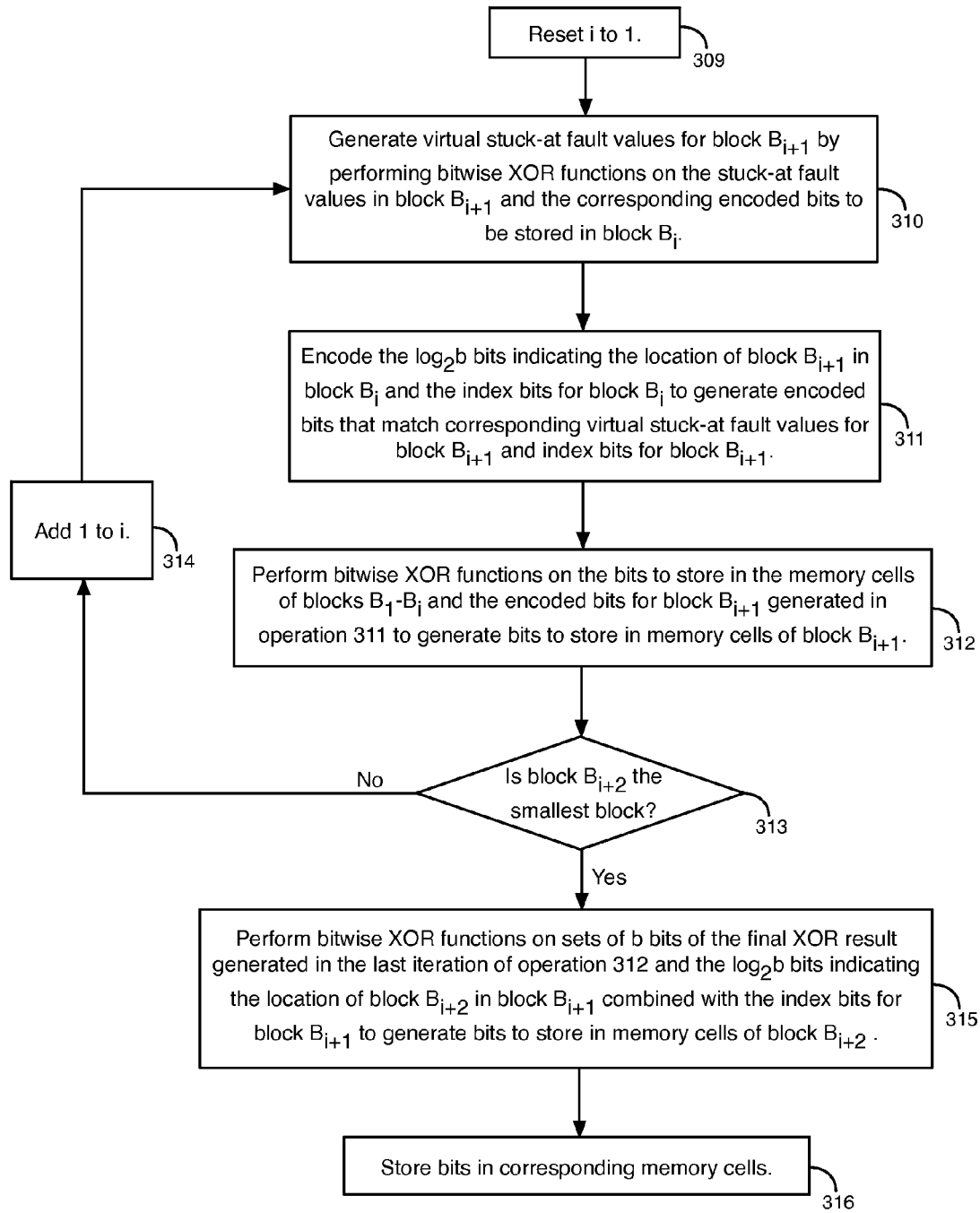

FIGS. 3A-3B illustrate examples of operations for encoding data bits to generate encoded bits that accommodate stuck-at faults in memory cells, according to an embodiment of the present invention. The addresses of the memory cells with stuck-at faults and the digital values of the stuck-at faults are provided to the encoder prior to performing the operations of FIGS. 3A-3B. The encoded bits are stored in the memory cells. The encoded bits that are stored in memory cells having stuck-at faults have the same digital values as the stuck-at faults of the corresponding ones of those memory cells.

The encoder discussed herein may, for example, be implemented by control circuit 101. The encoder uses an encoding technique that can adjust digital values of the data bits that do not match the digital values of the stuck-at faults of the corresponding memory cells to generate encoded data bits and redundant bits. The redundant bits are used by a decoder to decode the encoded data bits to regenerate the data bits, as discussed below. Examples of encoding techniques that generate encoded data bits and redundant bits to accommodate memory cells having stuck-at faults and techniques for decoding the encoded data bits using the redundant bits are disclosed in commonly-assigned U.S. patent application Ser. Nos. 13/649,007 and 13/649,072, both filed on Oct. 10, 2012, and both of which are incorporated by reference herein in their entireties. According to some embodiments, the encoding and decoding techniques disclosed in these patent applications can be used with the techniques presented herein, as discussed below.

In operation 301, an encoder receives data bits that are provided for storage in a block $B_i$ of memory cells that has enough memory cells to store encoded data bits and redundant bits generated according to techniques described herein. The parameter "i" is a positive integer that equals 1 in operation 301. Thus, block $B_i$ equals block $B_1$ in operation 301. In operation 302, the encoder divides block $B_i$ of memory cells into a "b" number of segments that each has the same number of memory cells. Parameter "b" is a positive integer that is based on the ratio between the number D of data bits and the number R of redundant bits generated by the encoder for the data bits using the selected encoding technique. As an example, b≤D/R. In the first iteration of operations 302-303, block $B_i$ is block $B_1$.

In operation 303, the encoder selects the segment in block $B_i$ having the least number of stuck-at faults as block $K_{i+1}$ among the "b" number of segments generated in operation 302. Also in operation 303, the encoder generates $\log_2 b$ bits to indicate the location of block $K_{i+1}$ in block B. If two or more segments of block $B_i$ have the least number of stuck-at faults, then the encoder selects one of these segments in operation 303. In the first iteration of operation 303, the encoder selects the segment in block $B_1$ having the least number of stuck-at faults as block $B_2$.

In decision operation 304, the encoder determines if block $K_{i+1}$ has one or zero stuck-at faults. If block $K_{i+1}$ has one or zero stuck-at faults, the process of FIGS. 3A-3B proceeds to operation 306. If block $B_{i+1}$ has more than one stuck-at fault, the process of FIGS. 3A-3B proceeds to operation 305. In operation 305, the encoder adds 1 to the parameter i. The encoder then repeats operations 302-304. In the second iteration of operations 302-304, block $B_i$ is block $B_2$, and block $K_{i+1}$ is block $B_3$. The encoder continues to perform iterations of operations 302-305 until block $K_{i+1}$ has only one or zero stuck-at faults. This process stops at the latest when the number of bits in block $B_{i+1}$ is equal to the inverse of the stuck-at bit error rate in the data bits. The encoder generates one or more blocks in operations 302-305 for storing redundant bits that are used by a decoder to decode the encoded data bits, as described below.

In operation 306, the encoder encodes the data bits to generate index bits for the largest block $B_1$ and encoded data bits to store in memory cells of the largest block $B_1$ using an encoding technique that causes the encoded data bits to accommodate any stuck-at faults in the memory cells of block $B_1$. The encoding technique used in operation 306 may be, for example, one of the encoding techniques disclosed in U.S. patent application Ser. Nos. 13/649,007 and 13/649,072. The index bits are redundant bits that are used by a decoder to decode the encoded data bits to regenerate the data bits. After operation 306, the process continues to operation 309. Operations 309-316 are shown in FIG. 3B.

In operation 309, the encoder resets the parameter i to 1. In operation 310, the encoder generates virtual stuck-at fault values for block $K_{i+1}$ by performing bitwise XOR functions on the stuck-at fault values in block $K_{i+1}$ and the corresponding encoded bits to be stored in block $B_i$. A bitwise XOR function is a logic function that takes two bit patterns of equal length and performs the logical exclusive OR operation on each pair of corresponding bits. The result in each position is 1 only if the first bit is 1 or only if the second bit is 1. The result is 0 if both bits are 0 or if both bits are 1. In the first iteration of operation 310, the encoded bits to be stored in block $B_i$ are the encoded data bits generated in operation 306.

As an example of operation 310 that is not intended to be limiting, i equals 1, block $B_2$ has 8 memory cells, and the third and seventh memory cells in block $B_2$ have stuck-at faults. In this example, an XOR function is performed on the stuck-at fault value of the third memory cell in block $B_2$ and each corresponding third encoded data bit in each set of 8 bits in the encoded data bits to be stored in block $B_1$ that are generated in operation 306 to generate a first virtual stuck-at fault value. Also, an XOR function is performed on the stuck-at fault value of the seventh memory cell in block $B_2$ and each corresponding seventh encoded data bit in each set of 8 bits in the encoded data bits to be stored in block $B_1$ that are generated in operation 306 to generate a second virtual stuck-at fault value.

In operation 311, the encoder encodes the $\log_2 b$ bits indicating the location of block $K_{i+1}$ in block $B_i$ and the index bits for block $B_i$ to generate encoded bits that match corresponding virtual stuck-at fault values for block $B_{i+1}$ and index bits for block $B_{i+1}$ using an encoding technique that accommodates memory cells having stuck-at faults. The encoding technique used in operation 311 may be, for example, the same encoding technique used in operation 306. The encoded bits generated in operation 311 match the corresponding virtual stuck-at fault values for block $B_{i+1}$ that are generated in operation 310.

In operation 312, the encoder performs bitwise XOR functions on the bits to store in the memory cells of blocks $B_1$-$B_i$, and the encoded bits for block $K_{i+1}$ to generate bits to store in memory cells of block $B_{i+1}$. In the first iteration of operation 312, the bits to store in the memory cells of blocks $B_1$-$B_i$, are the encoded data bits generated in operation 306. In the subsequent iterations of operation 312, the bits to store in the memory cells of blocks $B_1$-$B_i$ are the bits generated in all of the preceding iterations of operation 312 and the encoded data bits generated in operation 306. In each iteration of operation 312, the encoded bits for block $K_{i+1}$ are generated in the preceding iteration of operation 311.

In operation 312, the bits to store in the memory cells of block $B_i$ are divided into sets $S_i$ of bits, such that the number of bits in each of the sets $S_i$ equals the number of memory cells in block $K_{i+1}$. A bitwise XOR function is then performed on two of the sets $S_i$ of bits to generate a first XOR result. If there are more than two of the sets $S_i$ of bits, a bitwise XOR function is performed on the first XOR result and a third one of the sets $S_i$ of bits to generate a second XOR result. Bitwise XOR functions continue to be performed on the previously generated XOR result and each additional set $S_i$ of bits to generate the next XOR result, until there are no additional sets $S_i$ of bits.

A final bitwise XOR function is then performed in operation 312 on the last XOR result that was generated from the sets $S_i$ of bits and the encoded bits for block $B_{i+1}$ to generate bits to store in corresponding memory cells of block $K_{i+1}$. The final bitwise XOR function is not performed in operation 312 on bits corresponding to the bit positions of block $B_{i+2}$. Bits have not yet been generated to store in the memory cells of block $B_{i+2}$ in operation 312. The final XOR result of the final bitwise XOR function of operation 312 includes the bits to store in corresponding memory cells of block $B_{i+1}$ and the bits corresponding to the bit positions of block $B_{i+2}$ in the last XOR result that was generated from the sets $S_i$ of bits. The final XOR result of the final bitwise XOR function of the last iteration of operation 312 is used in operation 315, as described below.

In decision operation 313, the encoder determines if block $B_{i+2}$ is the smallest block of memory cells that was generated in the iterations of operations 302-305. If block $B_{i+2}$ is not the smallest block of memory cells that was generated in the iterations of operations 302-305, the encoder proceeds to operation 314. In operation 314, the encoder adds 1 to the parameter i. Then, the encoder performs another iteration of operations 310-313. The encoder continues to perform iterations of operations 310-314 until block $B_{i+2}$ equals the smallest block of memory cells generated in the iterations of operations 302-305.

If block $B_{i+2}$ is the smallest block of memory cells that was generated in the iterations of operations 302-305 at operation 313, the encoder proceeds to operation 315. In operation 315, the encoder performs bitwise XOR logic functions on sets of b bits of the final XOR result generated in the last iteration of operation 312 and the $\log_2 b$ bits indicating the location of block $B_{i+2}$ in block $B_{i+1}$ combined with the index bits for block $B_{i+1}$ to generate bits to store in memory cells of block $B_{i+2}$.

In operation 315, bits of the final XOR result generated in the last iteration of operation 312 are divided into sets $S_F$ of bits, such that the number of bits in each of the sets $S_F$ equals b. A bitwise XOR function is then performed on two of the sets $S_F$ of bits to generate a first XOR result. If there are more than two of the sets $S_F$ of bits, a bitwise XOR function is performed on the first XOR result and a third one of the sets $S_F$ of bits to generate a second XOR result. Bitwise XOR functions continue to be performed on the previously generated XOR result and each additional set of bits $S_F$ to generate the next XOR result, until there are no additional sets of bits $S_F$. A final bitwise XOR function is then performed in operation 315 on the last XOR result that was generated from the sets $S_F$ of bits and the $\log_2 b$ bits indicating the location of block $B_{i+2}$ in block $K_{i+1}$ combined with the index bits for block $K_{i+1}$ to generate bits to store in memory cells of block $B_{i+2}$.

If block $B_{i+2}$ has one stuck-at fault, then any bit stored in the memory cell of block $B_{i+2}$ having the stuck-at fault must match the digital value of that stuck-at fault. If block $B_{i+2}$ contains p bits and exactly one stuck-at fault, a p−1 number of bits can be stored as follows. The first bit is designated to indicate if the remaining p−1 bits should be inverted or not. If the first bit has a digital value of 0, then the remaining p−1 bits are read as they are. If the first bit has a digital value of 1, then the remaining p−1 bits are inverted. The stuck-at fault can be in the first bit position or in one of the remaining p−1 bit positions of block $B_{i+2}$. If the stuck-at fault is in the first bit position, then its value indicates how the data is stored in the remaining p−1 bits (i.e., inverted or not). If the stuck-at fault is in one of the remaining p−1 bit positions other than the first one, then the stuck-at fault value is checked to determine if it has the same digital value or not as the data bit that should be stored at that bit position. If it has the same digital value, then the first bit is set to 0, and the data is written as is in the remaining p−1 bit positions. If it has the opposite digital value, then the first bit is set to 1, and the inverted values of the data bits are stored in the remaining p−1 bit positions.

In operation 316, the encoded data bits generated in operations 306, the bits generated in each iteration of operation 312, and the bits generated in operation 315 are stored in the corresponding memory cells of the memory circuit.

Figure 4:
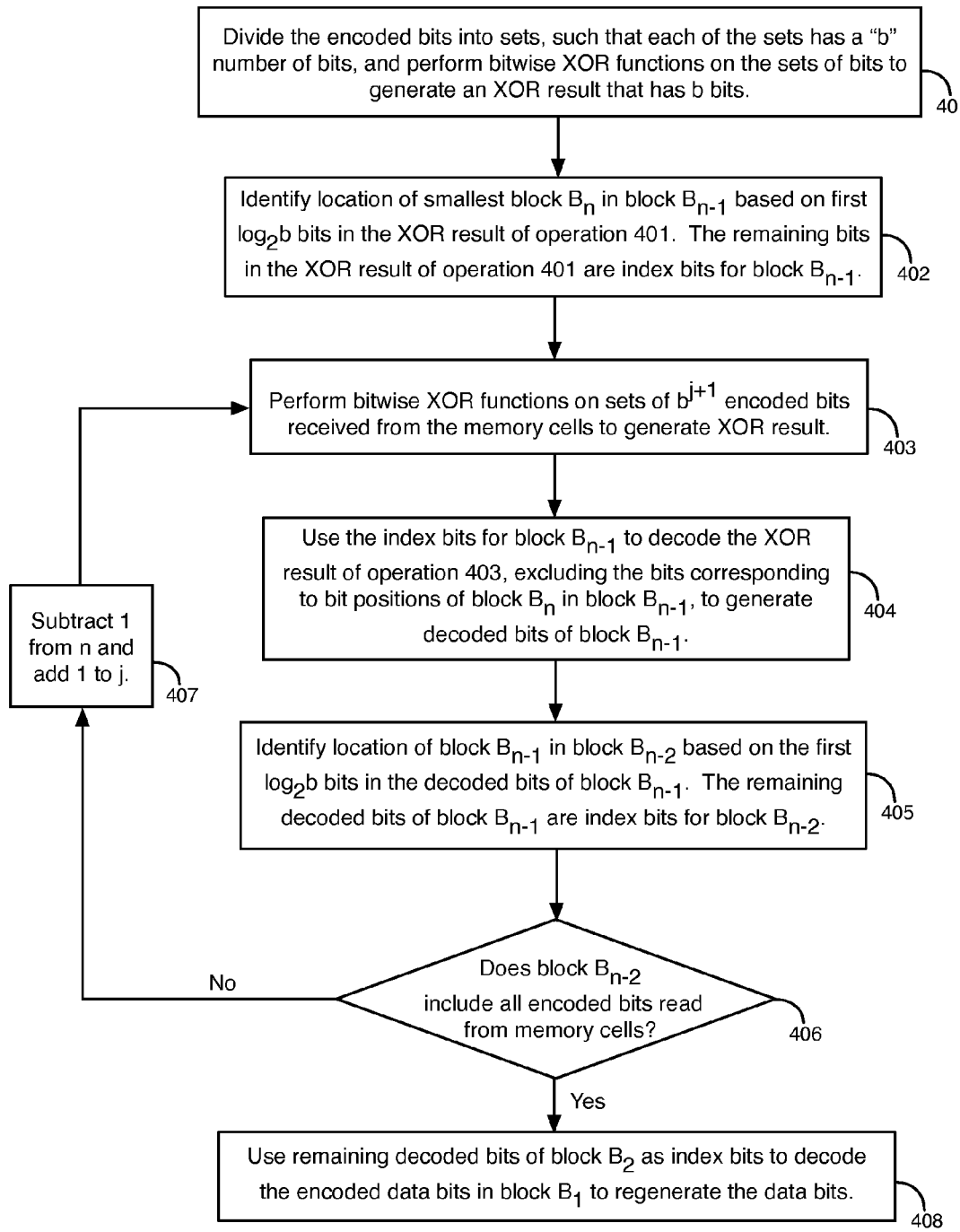
FIG. 4 illustrates examples of operations for decoding encoded bits to regenerate data bits, according to an embodiment of the present invention.

FIG. 4 illustrates examples of operations for decoding encoded bits to regenerate data bits, according to an embodiment of the present invention. Encoded bits are read from the memory cells of the memory circuit and provided to a decoder. The decoder may, for example, be implemented by control circuit 101.

Initially, the decoder receives encoded bits from memory cells of a memory circuit. In operation 401, the decoder divides the encoded bits into sets $S_D$, such that each of the sets $S_D$ has a "b" number of bits that are consecutive according to their bit positions. The parameter "b" has the same value that was used during encoding to generate the encoded bits. The parameter "b" is provided to the decoder prior to decoding the encoded bits. The decoder then performs bitwise XOR functions on the sets $S_D$ of bits to generate an XOR result that has b bits in operation 401.

In operation 402, parameter "n" indicates the number $B_n$ of the smallest block of memory cells generated in the iterations of operations 302-305. In operation 402, the decoder identifies the location of the smallest block $B_n$ in block $K_{n-1}$ based on the first $\log_2 b$ bits in the XOR result of operation 401. The remaining bits in the XOR result of operation 401 are index bits for block $B_{n-1}$.

In operation 403, the decoder performs bitwise XOR functions on sets of $b^{j+1}$ encoded bits received from the memory cells to generate an XOR result. In operation 403, the decoder divides the encoded bits into sets $S_G$, such that each of the sets $S_G$ has a $b^{j+1}$ number of bits that are consecutive according to their bit positions. The decoder then performs bitwise XOR functions on the sets $S_G$ of bits to generate the XOR result that has $b^{j+1}$ bits. In the first iteration of operation 403, parameter j equals 1.

In operation 404, the decoder uses the index bits for block $B_{n-1}$ to decode the XOR result of operation 403, excluding the bits corresponding to bit positions of block $B_n$ in block $B_{n-1}$, to generate decoded bits of block $B_{n-1}$ using a decoding technique. In the first iteration of operation 404, the index bits for block $B_{n-1}$ are identified in operation 402, and the bit positions of block $B_n$ in block $K_{i+1}$ are identified in operation 402. In subsequent iterations of operation 404, the index bits for block $B_{n-1}$ are generated and identified in the preceding iterations of operations 404-405, and the bit positions of block $B_n$ in block $B_{n-1}$ are identified in the preceding iteration of operation 405. The decoding technique used in operation 404 performs the inverse of the encoding operations used in the encoding technique of operation 311 that accommodates any stuck-at faults in the memory cells. The decoding technique used in operation 404 may be, for example, one of the decoding techniques disclosed in U.S. patent application Ser. Nos. 13/649,007 and 13/649,072.

In operation 405, the decoder identifies the location (and the corresponding bit positions) of block $B_{n-1}$ in block $B_{n-2}$ based on the first $\log_2 b$ bits in the decoded bits of block $B_{n-1}$ that are generated in the preceding iteration of operation 404. The remaining decoded bits of block $B_{n-1}$ generated in the preceding iteration of operation 404 are index bits for block $B_{n-2}$.

In decision operation 406, the decoder determines if block $B_{n-2}$ includes all of the encoded bits read from the memory cells. If block $B_{n-2}$ does not include all of the encoded bits read from the memory cells, then the decoder proceeds to operation 407. In operation 407, the decoder subtracts 1 from parameter n and adds 1 to parameter j. The decoder then performs a second iteration of operations 403-406. The decoder continues to perform iterations of operations 403-407 until block $B_{n-2}$ equals the largest block $B_1$.

If block $B_{n-2}$ includes all of the encoded bits read from the memory cells (i.e., block $B_{n-2}$ equals the largest block $B_1$) in decision operation 406, then the decoder proceeds to operation 408. In operation 408, the decoder uses the remaining decoded bits of block $B_2$ as index bits to decode the encoded data bits in block $B_1$ to regenerate the data bits using a decoding technique. In operation 408, the remaining decoded bits of block $B_2$ are generated in the preceding iteration of operation 405, and the encoded data bits in block $B_1$ are the remaining encoded bits in block $B_1$ that have not yet been decoded. The decoding technique used in operation 408 performs the inverse of the encoding operations used in the encoding technique of operation 306. The decoding technique of operation 408 may be the same decoding technique used in operation 404.

FIGS. 5A-5I illustrate examples of the encoding operations shown in and described above with respect to FIGS. 3A-3B, according to embodiments of the present invention. The examples shown and described herein with respect to FIGS. 5A-5I are disclosed merely for the purpose of illustration and are not intended to be limiting.

FIGS. 5A-5B illustrate an exemplary set of 64 memory cells. The 64 memory cells are shown as 64 boxes in FIGS. 5A-5B. 15 of the 64 memory cells shown in FIGS. 5A-5B have stuck-at faults. The vertical lines above the boxes in FIG. 5A delineate segments of 4, 8, and 16 memory cells. The memory cells labeled with a 0 are stuck-at 0, and the memory cells labeled with a 1 are stuck-at 1. Nine of the memory cells shown in FIGS. 5A-5B have stuck-at 1 faults, and six of the memory cells shown in FIGS. 5A-5B have stuck-at 0 faults.

FIG. 5B illustrates an example of how the 64 memory cells can be divided into three blocks $B_1$, $B_2$, and $B_3$ during the encoding operations 302-305 shown in FIG. 3A. The largest block $B_1$ includes all 64 memory cells. Block $B_1$ includes block $B_2$ and three sub-blocks $B_{1A}$, $B_{1B}$, and $B_{1C}$ that each have 16 memory cells. Block $B_2$ includes block $B_3$ that has 4 memory cells. Block $B_2$ has three memory cells having stuck-at faults. Block $B_3$ has no stuck-at faults.

Figure 5C:
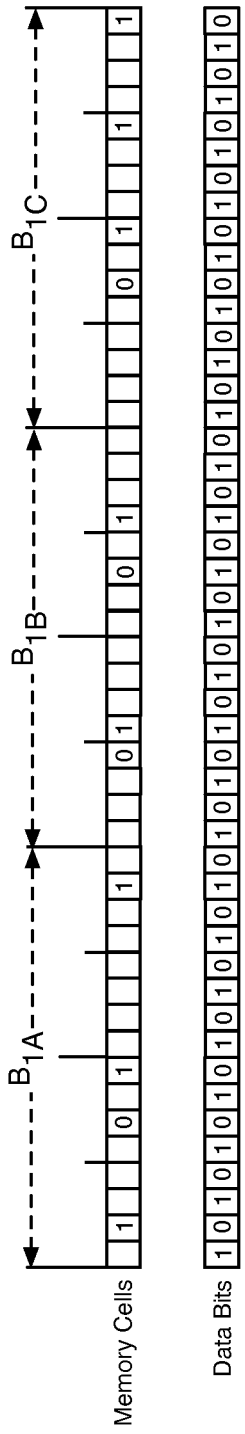

FIG. 5C illustrates digital values of 48 data bits that are provided for storage in the memory cells shown in FIG. 5A. The memory cells of block $B_2$ are reserved for storing redundant bits according to the techniques described herein with respect to FIGS. 3A-3B. Therefore, the 48 data bits shown in FIG. 5C are provided for storage in the 48 corresponding memory cells in sub-blocks $B_{1A}$, $B_{1B}$, and $B_{1C}$.

Figure 5D:
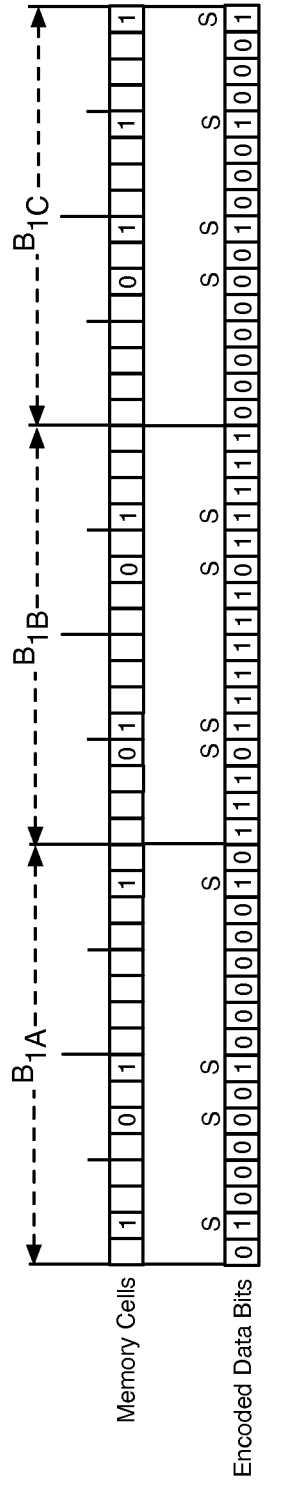

In operation 306, the encoder encodes the 48 data bits to generate 48 encoded data bits and 10 index bits, as shown for example in FIG. 5D. The 48 encoded data bits and 10 index bits shown in FIG. 5D are arbitrary values that are provided as an example and are not generated by any particular encoding technique. Each of the 48 encoded data bits is stored in a corresponding one of the 48 memory cells of sub-blocks $B_{1A}$-$B_{1C}$ that is directly above that encoded data bit in FIG. 5D. The encoded data bits each indicated by an S in FIG. 5D have the same digital values as the stuck-at faults of their corresponding memory cells of sub-blocks $B_{1A}$-$B_{1C}$. Thus, the 48 encoded data bits shown in FIG. 5D can be stored in the 48 memory cells of sub-blocks $B_{1A}$-$B_{1C}$ and read from the 48 memory cells of sub-blocks $B_{1A}$-$B_{1C}$ without errors caused by the 12 known stuck-at faults in these 48 memory cells.

In the examples of FIGS. 5A-5I, b equals 4, and $\log_2 b$ equals 2. FIG. 5D also shows the digital values of 2 binary location bits 10 (i.e., equal to 3 in decimal) indicating the location of block $B_2$ as the third segment of 16 bits in block $B_1$. The 2 location bits of block $B_2$ are generated in operation 303.

FIG. 5E illustrates an example of how virtual stuck-at fault values can be generated according to operation 310. As shown in FIG. 5E, XOR logic functions are performed on the stuck-at fault value of 0 of the third memory cell in block $B_2$, the third encoded data bit 0 to be stored in sub-block $B_{1A}$, the third encoded data bit 1 to be stored in sub-block $B_{1B}$, and the third encoded data bit 0 to be stored in sub-block $B_{1C}$ (as shown by the long dash dotted lines) to generate a virtual stuck-at fault value of 1. XOR logic functions are performed on the stuck-at fault value of 1 of the tenth memory cell in block $B_2$, the tenth encoded data bit 0 to be stored in sub-block $B_{1A}$, the tenth encoded data bit 1 to be stored in sub-block $B_{1B}$, and the tenth encoded data bit 0 to be stored in sub-block $B_{1C}$ (as shown by the short dash dotted lines) to generate a virtual stuck-at fault value of 0. XOR logic functions are also performed on the stuck-at fault value of 0 of the twelfth memory cell in block $B_2$, the twelfth encoded data bit to be stored in sub-block $B_{1A}$, the twelfth encoded data bit to be stored in sub-block $B_{1B}$, and the twelfth encoded data bit to be stored in sub-block $B_{1C}$ (not shown by dotted lines) to generate a virtual stuck-at fault value of 0.

In operation 311, the location bits for block $B_2$ and the index bits for block $B_1$ are encoded based on the three virtual stuck-at faults values to generate encoded bits for block $B_2$ and index bits for block $B_2$, as shown in FIG. 5F. The three encoded bits for block $B_2$ that are each below a V in FIG. 5F match the three corresponding virtual stuck-at fault values generated in operation 310. The 12 encoded bits and 2 index bits for block $B_2$ shown in FIG. 5F are arbitrary values that are provided as example and are not generated by any particular encoding technique.

Figure 5G:
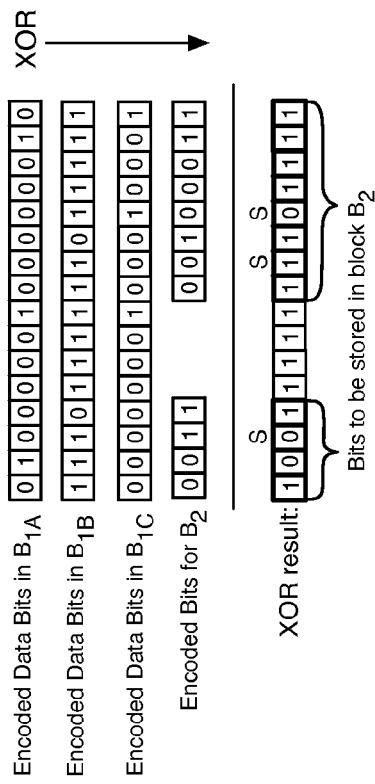

In operation 312, bitwise XOR logic functions are performed on the encoded data bits to store in the memory cells of sub-blocks $B_{1A}$-$B_{1C}$ and the encoded bits for block $B_2$ generated in operation 311 to generate bits to store in memory cells of block $B_2$, as shown in FIG. 5G.

More specifically, three bitwise XOR logic functions are performed in operation 312 in the example of FIG. 5G. The first bitwise XOR logic function is performed on the 16 encoded data bits to store in the memory cells of sub-block $B_{1A}$ and the 16 encoded data bits to store in the memory cells of sub-block $B_{1B}$ to generate a first 16-bit intermediate result. The second bitwise XOR logic function is performed on the first 16-bit intermediate result and the 16 encoded data bits to store in the memory cells of sub-block $B_{1C}$ to generate a second 16-bit intermediate result. The third bitwise XOR logic function is performed on 12 bits of the second 16-bit intermediate result and the corresponding 12 encoded bits for block $B_2$ that were generated in operation 311 to generate 12 bits to store in the memory cells of block $B_2$, as shown in FIG. 5G.

The $1^{st}$-$4^{th}$ and $9^{th}$-$16^{th}$ bits of the 16-bit XOR result shown in FIG. 5G are 12 bits to store in the corresponding $1^{st}$-$4^{th}$ and $9^{th}$-$16^{th}$ memory cells of block $B_2$. The $3^{rd}$, $10^{th}$, and $12^{th}$ bits of the XOR result shown in FIG. 5G match the corresponding stuck-at fault values of the $3^{rd}$, $10^{th}$, and $12^{th}$ memory cells of block $B_2$, shown in FIG. 5B.

The $5^{th}$-$8^{th}$ bits of the XOR result shown in FIG. 5G are the $5^{th}$-$8^{th}$ bits of the second 16-bit intermediate result of the second bitwise XOR logic function performed in operation 312. The $5^{th}$-$8^{th}$ bits of the second 16-bit intermediate result of the second bitwise XOR logic function performed in operation 312 are not used in the third bitwise XOR logic function of operation 312.

Figure 5H:
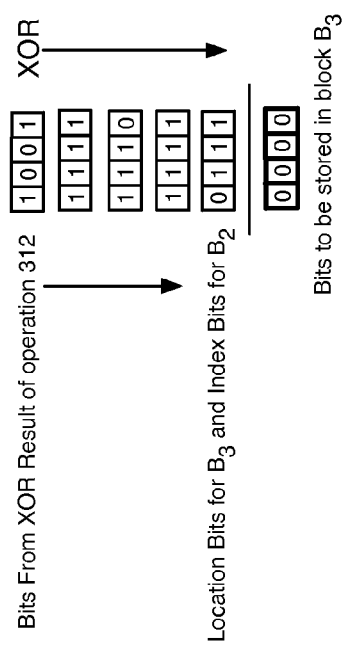

In operation 315, bitwise XOR logic functions are performed on the XOR results of operation 312 and the $\log_2 b$ bits indicating the location of block $B_3$ in block $B_2$ combined with the index bits for block $B_2$ to generate bits to store in the memory cells of block $B_3$, as shown in FIG. 5H. More specifically, four bitwise XOR logic functions are performed in operation 315 in the example of FIG. 5H. Each of the four bitwise XOR logic functions are performed on two sets of 4 bits.

The first bitwise XOR logic function is performed on the $1^{st}$-$4^{th}$ bits of the 16-bit XOR result shown in FIG. 5G and the $5^{th}$-$8^{th}$ bits of the 16-bit XOR result shown in FIG. 5G to generate a first 4-bit intermediate result. The second bitwise XOR logic function is performed on the first 4-bit intermediate result of operation 315 and the $9^{th}$-$12^{th}$ bits of the 16-bit XOR result shown in FIG. 5G to generate a second 4-bit intermediate result. The third bitwise XOR logic function is performed on the second 4-bit intermediate result of operation 315 and the $13^{th}$-$16^{th}$ bits of the 16-bit XOR result shown in FIG. 5G to generate 4 bits to store in the memory cells of block $B_3$, as shown in FIG. 5H.

Figure 5I:
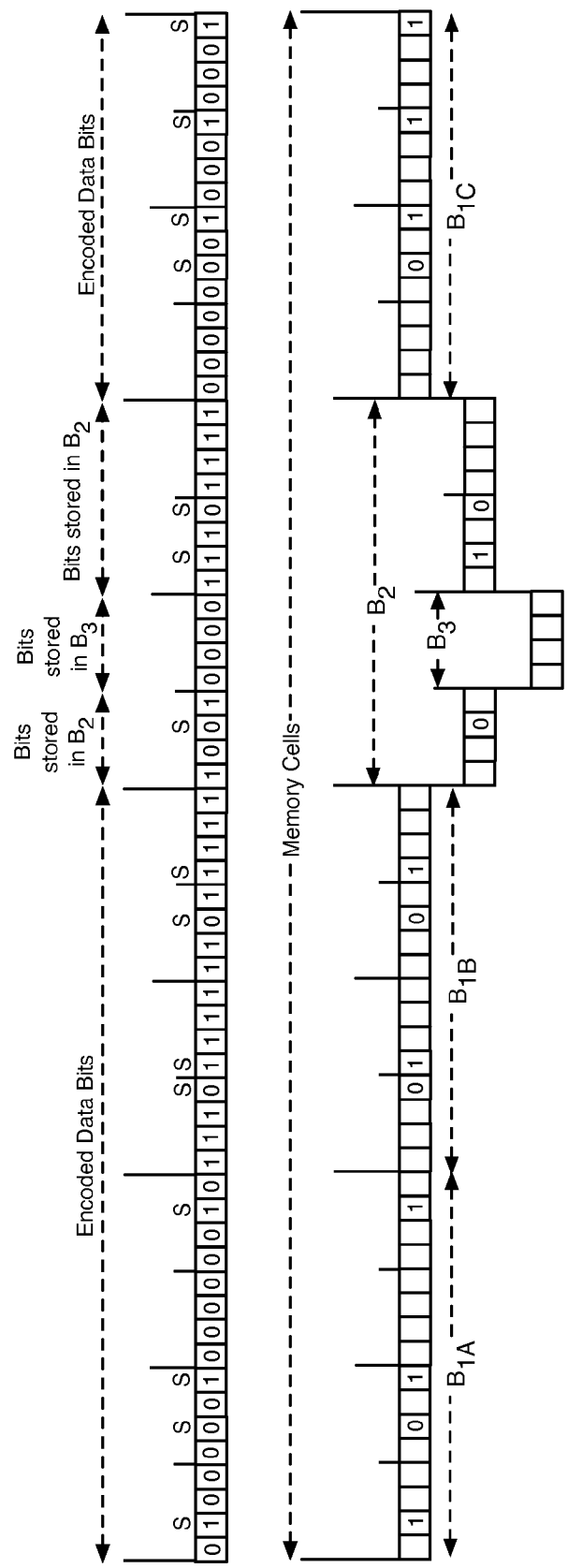

In the examples of FIGS. 5A-5I, block $B_3$ is the smallest block. Therefore, no additional iterations of operations 310-314 are performed. In operation 316, the encoded data bits generated in operation 306 are stored in the corresponding memory cells of sub-blocks $B_{1A}$-$B_{1C}$, as shown in FIG. 5I. Also, in operation 316, the 12 bits generated in operation 312 to store in block $B_2$ are stored in the corresponding memory cells of block $B_2$, and the 4 bits generated in operation 315 to store in block $B_3$ are stored in the corresponding memory cells of block $B_3$, as shown in FIG. 5I. Each of the memory cells shown in FIG. 5I labeled a 1 or 0 in the memory cell has a stuck-at fault with the labeled value, as described above with respect to FIG. 5A. Each of the bits to be stored in a memory cell having a stuck-at fault has the same digital value as that stuck-at fault, as shown in FIG. 5I. The decoding operations 401-408 of FIG. 4 can be used on the examples of FIGS. 5A-5I, by performing the steps of the encoding process in reverse.

Embodiments of the present invention can, for example, be implemented using one or a combination of hardware, software, and a computer-readable medium containing program instructions. Embodiments of the present invention can be embodied as program code stored on a non-transitory computer readable medium that can be run on a computer. Software implemented by embodiments of the present invention and results of the present invention can be stored on a computer-readable medium such as semiconductor memory, hard disk drive, compact disc (CD), digital video disc (DVD), or other media. Results of the present invention can be used for various purposes such as being executed or processed by a processor, being displayed to a user, transmitted in a signal over a network, etc. Embodiments of the present invention may also be embodied as a computer readable program code unit stored on a non-transitory computer readable medium, for causing a number of computer systems connected via a network to affect distributed processing.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A data storage system comprising:
a memory circuit comprising memory cells; and
a control circuit to receive data bits provided for storage in the memory cells,
wherein the control circuit encodes the data bits to generate a first set of redundant bits and encoded data bits such that the encoded data bits selected for storage in a first subset of the memory cells with first stuck-at faults have digital values of corresponding ones of the first stuck-at faults,
wherein the control circuit encodes the first set of redundant bits to generate a second set of redundant bits, and wherein the control circuit performs logic functions on the second set of redundant bits and the encoded data bits to generate a third set of redundant bits such that redundant bits in the third set of redundant bits selected for storage in a second subset of the memory cells with second stuck-at faults have digital values of corresponding ones of the second stuck-at faults.

2. The data storage system of claim 1, wherein the control circuit generates virtual stuck-at fault values by performing logic functions on the digital values of the second stuck-at faults and a subset of the encoded data bits corresponding to the second stuck-at faults, and wherein the control circuit encodes the first set of redundant bits to generate the second set of redundant bits to accommodate the virtual stuck-at fault values.

3. The data storage system of claim 1, wherein the control circuit performs bitwise XOR logic functions on the second set of redundant bits and the encoded data bits to generate the third set of redundant bits.

4. The data storage system of claim 1, wherein the control circuit performs logic functions on the third set of redundant bits and a fourth set of redundant bits to generate a fifth set of redundant bits to store in a third subset of the memory cells.

5. The data storage system of claim 1, wherein the control circuit performs bitwise XOR logic functions on the third set of redundant bits and a fourth set of redundant bits to generate a fifth set of redundant bits to store in a third subset of the memory cells, wherein the control circuit encodes the first set of redundant bits to generate the second set of redundant bits and a sixth set of redundant bits, and wherein the fourth set of redundant bits comprises the sixth set of redundant bits and bits that indicate a location of the third subset of the memory cells.

6. The data storage system of claim 1, wherein the encoded data bits and the third set of redundant bits are provided for storage in selected ones of the memory cells.

7. The data storage system of claim 6, wherein the control circuit encodes the first set of redundant bits and bits that indicate a location of the memory cells selected to store the third set of redundant bits to generate the second set of redundant bits.

8. A data storage system comprising:
a memory circuit comprising memory cells; and
a control circuit to receive encoded bits read from the memory cells, wherein the encoded bits accommodate stuck-at faults in the memory cells,
wherein the control circuit performs bitwise logic functions on first sets of the encoded bits to generate first intermediate bits, wherein the control circuit is performs the bitwise logic functions on second sets of the encoded bits to generate second intermediate bits, wherein each of the second sets has more bits than each of the first sets,
wherein the control circuit decodes the second intermediate bits using the first intermediate bits to generate first decoded bits, and wherein the control circuit decodes a first subset of the encoded bits using the first decoded bits to generate decoded data bits.

9. The data storage system of claim 8, wherein the bitwise logic functions are bitwise XOR logic functions.

10. The data storage system of claim 9, wherein a first subset of the first decoded bits indicate a location of bits in a second subset of the encoded bits that are not decoded to generate the decoded data bits, and a second subset of the first decoded bits are used to decode the first subset of the encoded bits to generate the decoded data bits.

11. The data storage system of claim 8, wherein a first subset of the first intermediate bits indicate a location of bits in the second intermediate bits that are not decoded using a second subset of the first intermediate bits to generate the first decoded bits.

12. The data storage system of claim 11, wherein the bitwise logic functions are bitwise XOR logic functions.

13. A method performed by a data storage system, the method comprising:
receiving data bits that are provided for storage in memory cells of a memory circuit in the data storage system;
encoding the data bits to generate a first set of redundant bits and encoded data bits such that the encoded data bits selected for storage in a first subset of the memory cells with first stuck-at faults have digital values of corresponding ones of the first stuck-at faults;
encoding the first set of redundant bits to generate a second set of redundant bits; and
performing logic functions on the second set of redundant bits and the encoded data bits to generate a third set of redundant bits such that redundant bits in the third set of redundant bits selected for storage in a second subset of the memory cells with second stuck-at faults have digital values of corresponding ones of the second stuck-at faults.

14. The method of claim 13, further comprising:
generating virtual stuck-at fault values by performing logic functions on the digital values of the second stuck-at faults and a subset of the encoded data bits corresponding to the second stuck-at faults,
wherein encoding the first set of redundant bits to generate a second set of redundant bits comprises encoding the first set of redundant bits to generate the second set of redundant bits to accommodate the virtual stuck-at fault values.

15. The method of claim 13, wherein performing logic functions on the second set of redundant bits and the encoded data bits to generate a third set of redundant bits comprises performing bitwise XOR logic functions on the second set of redundant bits and the encoded data bits to generate the third set of redundant bits.

16. The method of claim 13, further comprising:
performing bitwise XOR logic functions on the third set of redundant bits and a fourth set of redundant bits to generate a fifth set of redundant bits to store in a third subset of the memory cells.

17. The method of claim 16, wherein encoding the first set of redundant bits to generate a second set of redundant bits comprises encoding the first set of redundant bits to generate the second set of redundant bits and a sixth set of redundant bits, wherein the fourth set of redundant bits comprises the sixth set of redundant bits and bits that indicate a location of the third subset of the memory cells.

18. The method of claim 13, wherein encoding the first set of redundant bits to generate a second set of redundant bits comprises encoding the first set of redundant bits and bits that indicate a location of the memory cells selected to store the third set of redundant bits to generate the second set of redundant bits, and wherein the method is performed by a control circuit.

19. A method performed by a data storage system, the method comprising:
receiving encoded bits read from memory cells of a memory circuit in the data storage system, wherein the encoded bits accommodate stuck-at faults in the memory cells;
performing bitwise logic functions on first sets of the encoded bits to generate first intermediate bits;
performing bitwise logic functions on second sets of the encoded bits to generate second intermediate bits, wherein each of the second sets has more bits than each of the first sets;
decoding the second intermediate bits using the first intermediate bits to generate first decoded bits; and
decoding a first subset of the encoded bits using the first decoded bits to generate decoded data bits.

20. The method of claim 19, wherein the bitwise logic functions performed on the first and the second sets of the encoded bits are bitwise XOR logic functions,
wherein a first subset of the first intermediate bits indicate a location of bits in the second intermediate bits that are not decoded using a second subset of the first intermediate bits to generate the first decoded bits,
wherein a first subset of the first decoded bits indicate a location of bits in a second subset of the encoded bits that are not decoded to generate the decoded data bits, and a second subset of the first decoded bits are used to decode the first subset of the encoded bits to generate the decoded data bits, and wherein the method is performed by a control circuit.

* * * * *